United States Patent [19]
Hilton

[11] Patent Number: 6,124,745
[45] Date of Patent: Sep. 26, 2000

[54] DELAY AND INTERPOLATION TIMING STRUCTURES AND METHODS

[75] Inventor: Edward Barry Hilton, Wayland, Mass.

[73] Assignee: Analog Devices, Inc., Norwood, Mass.

[21] Appl. No.: 09/314,872

[22] Filed: May 19, 1999

[51] Int. Cl.[7] .................................................. H03K 5/13
[52] U.S. Cl. ........................................... 327/276; 327/280
[58] Field of Search ........................... 327/261, 262, 327/263, 266, 274, 276, 277, 278, 280, 281, 285, 287, 288

[56] References Cited

U.S. PATENT DOCUMENTS

| | | | |
|---|---|---|---|
| 4,801,827 | 1/1989 | Metz | 327/280 |
| 4,943,745 | 7/1990 | Watanabe et al. | 327/262 |
| 5,081,380 | 1/1992 | Chen | 327/262 |
| 5,428,626 | 6/1995 | Frisch et al. | 371/27 |
| 5,566,188 | 10/1996 | Robbins et al. | 371/27 |
| 6,034,570 | 3/2000 | Warwar | 331/57 |

*Primary Examiner*—Tuan T. Lam
*Assistant Examiner*—Linh Nguyen
*Attorney, Agent, or Firm*—Koppel & Jacobs

[57] ABSTRACT

Time-delay circuits are realized with first and second capacitors, a differential amplifier, a programmable current source and a differential pair of transistors. The current source directs first and second currents to the first and second capacitors and the differential pair steers a third current of the current source to either selected one of the capacitors to provide charging and discharging currents to the capacitors. The differential amplifier generates a delayed output pulse in response to voltages of the first and second capacitors. The capacitors are preferably formed by the interconnection system of an integrated circuit, i.e., the metallic circuit paths that are typically carried on an integrated-circuit substrate. N+1 of the delay circuits are combined with a phase comparator to form an interpolator that responds to an input data pulse by generating N output data pulses that span a period between the input data pulse and a successive input data pulse.

17 Claims, 2 Drawing Sheets

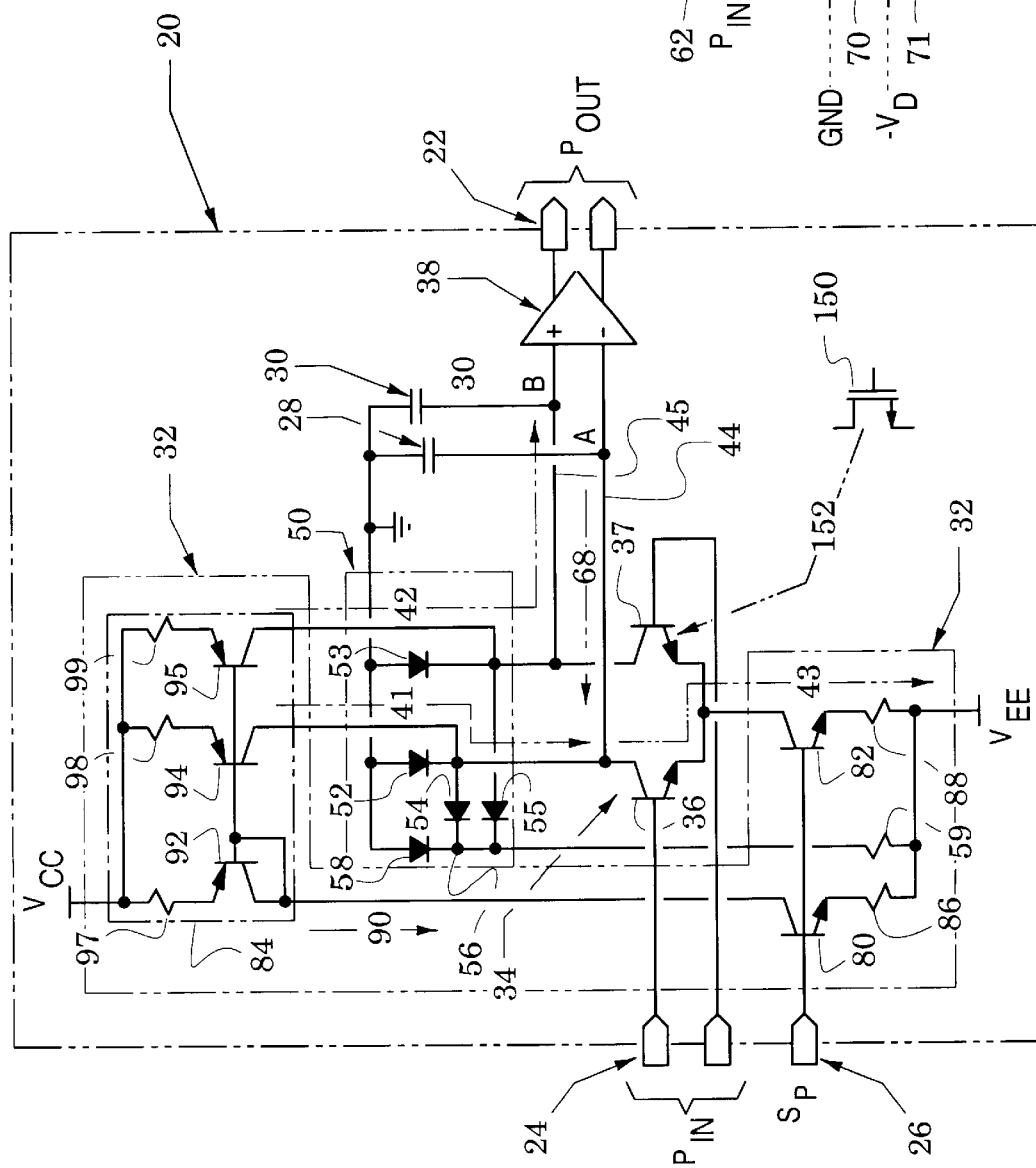
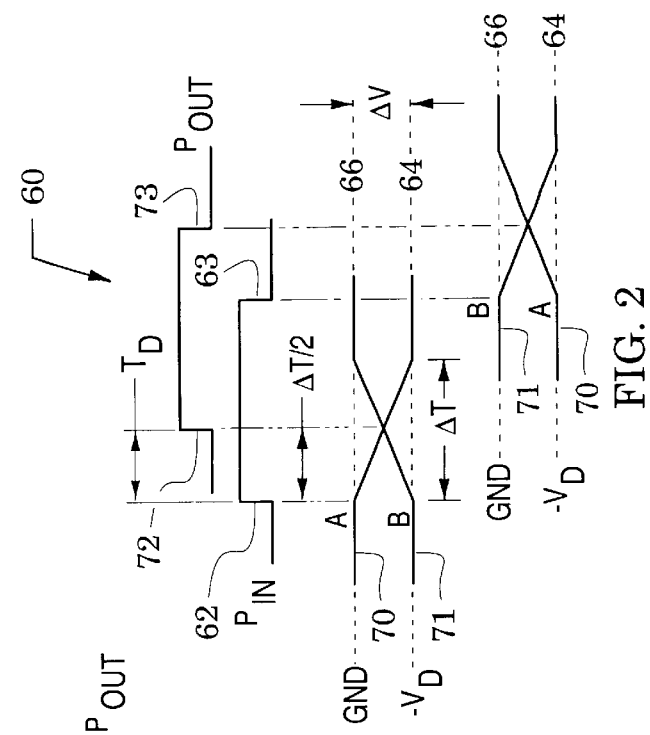

DELAY AND INTERPOLATION TIMING STRUCTURES AND METHODS

BACKGROUND OF THE INVENTION

1. Field of the Invention

The present invention relates generally to timing structures and, more particularly, to delay and interpolation structures.

2. Description of the Related Art

A number of delay and interpolation timing structures have been proposed. For example, U.S. Pat. No. 5,081,380 to Chen couples switching transistors between a programmable current source and a capacitive load in the form of an MOS transistor. Timing delay is realized through the switching transistors which enable current mirrors coupled to the current source to source and sink currents to the MOS transistor. As a second example, U.S. Pat. No. 5,428,626 to Frisch et al discloses a timing analyzer that forms an interpolator with a string of serially-connected, voltage-controlled delay elements and a plurality of inverters and transmission gates that are coupled periodically along the string to provide delayed output signals. As a final example, U.S. Pat. No. 5,566,188 to Robbins, et al. combines a phase locked loop, a FIFO and numerous gates and registers to form an interpolator circuit.

Yet there remains a need for simple, inexpensive but precise delay and interpolation structures that are suitable for a variety of timing uses, e.g., generation and application of test signals by automatic test equipment (ATE) to devices under test (DUT). Preferably, these structures are configured to facilitate their realization as application specific integrated circuits (ASICs) to further reduce their size and cost when produced in large volumes.

SUMMARY OF THE INVENTION

The present invention is directed to delay and interpolation timing circuits that are simple and precise and that lend themselves to economical integrated-circuit fabrication.

The delay circuits are realized with first and second capacitors, a differential amplifier, a programmable current source and a differential pair of transistors. The current source directs first and second currents to the first and second capacitors and the differential pair steers a third current of the current source to either selected one of the capacitors. The steered third current exceeds the first and second currents to provide charging and discharging currents to the capacitors. The differential amplifier generates a delayed output pulse in response to voltages of the first and second capacitors.

Preferably, the capacitors are formed by the interconnection system of an integrated circuit, i.e., the metallic circuit paths that are typically carried on an integrated-circuit substrate.

N+1 delay circuits of the invention are combined with a phase comparator to form an interpolator that responds to an input data pulse by generating N output data pulses that span a period between the input data pulse and a successive input data pulse. The delayed pulse of each delay circuit is an excitation pulse for a successive delay circuit except a final delayed pulse of a final delay circuit is fedback to the phase comparator where its phase is compared with that of the successive input data pulse.

A phase difference generates an error signal which adjusts the delay of all delay circuits to thereby cause the final delayed pulse to be time-coincident with the successive input data pulse. Accordingly, the other delayed pulses divide the period into substantially equal time intervals.

The novel features of the invention are set forth with particularity in the appended claims. The invention will be best understood from the following description when read in conjunction with the accompanying drawings.

BRIEF DESCRIPTION OF THE DRAWINGS

FIG. 1 is a schematic of a programmable time-delay circuit of the present invention;

FIG. 2 is a timing diagram that illustrates timing processes in the circuit of FIG. 1;

FIG. 3 is a sectional view of an integrated-circuit interconnection structure that forms parasitic capacitors in the circuit of FIG. 1;

DETAILED DESCRIPTION OF THE PREFERRED EMBODIMENTS

Figure 4:
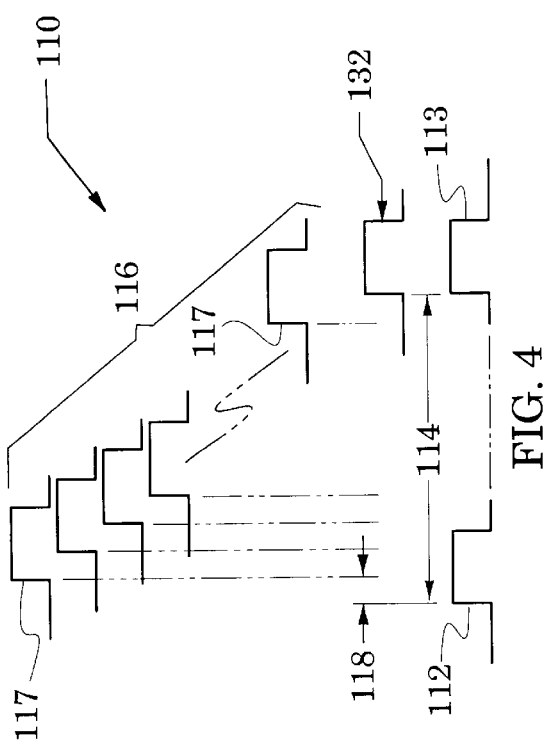
FIG. 4 is a timing diagram that illustrates timing processes in the circuit of FIG. 5.

FIG. 1 illustrates a programmable delay circuit 20 that generates an output pulse $P_{OUT}$ at an output port 22 in response to an input pulse $P_{IN}$ at an input port 24 with a time delay that is responsive to a program signal Sp at a program port 26.

In particular, the delay circuit 20 includes first and second capacitors 28 and 30, a current source 32, a differential pair 34 of first and second transistors 36 and 37 and a differential amplifier 38. The current source 32 is configured to generate first, second and third currents 41, 42 and 43 whose amplitudes are responsive to the program signal $S_P$ and wherein the third current exceeds the first and second currents.

The first and second currents are received onto first and second circuit paths 44 and 45 that respectively contact first and second steering terminals (i.e., collectors of transistors 36 and 37) of the differential amplifier 38 and respectively contact the first and second capacitors 28 and 30.

The differential pair 34 has its common terminals (i.e., its common emitters) coupled to the current source 32 to receive and steer the third current 43 to either selected one of the current paths 44 and 45. The program port 26 is formed by the control terminals (i.e., bases) of the transistors 36 and 37 and the output port 22 is formed by first and second outputs of the differential amplifier 38.

The delay circuit 20 further includes a clamp circuit 50 that limits voltages of the first and second capacitors 28 and 30 between upper and lower limits. The circuit 50 has a first clamp comprised of first and second diodes 52 and 53 coupled to ground and having their cathodes respectively coupled to the first and second circuit paths 44 and 45. It also has a second clamp comprised of third and fourth diodes 54 and 55 coupled to a voltage reference 56 and having their anodes respectively coupled to the first and second circuit paths 44 and 45. The reference 56 is formed by a reference diode 58 coupled to ground and having its anode coupled to another reference (e.g., $V_{EE}$) by a resistor 59.

An operational description of the programmable delay circuit 20 is enhanced with reference to circuit nodes A and B that are defined by the intersection of the first and second circuit paths 44 and 45 and the first and second capacitors 28 and 30.

FIG. 2 is a timing diagram 60 that illustrates an input pulse $P_{IN}$ having rising and falling edges 62 and 63 and an output pulse $P_{OUT}$ that is delayed by a time delay $T_D$ from the input pulse. The potentials of the circuit nodes A and B of FIG. 1 are limited to be above a voltage $-V_D$ that is established by diode drops of the clamping diodes 52 and 53 in FIG. 1 and this limit voltage is shown as a broken line 64 in FIG. 2. The potentials of the circuit nodes A and B are also limited to be below a voltage GND that is established by diode drops of the clamping diodes 54 and 55 in FIG. 1 and the offsetting diode drop of the reference diode 58. This limit voltage is indicated by a broken line 66 in FIG. 2.

To describe operation of the delay circuit, it is initially assumed that the capacitances of the first and second capacitors are equal and that the first and second currents 41 and 42 are equal to a current I and the third current 43 is double this current so that it equals a current 2I.

At the rising pulse edge 62 in FIG. 2, the third current 43 of FIG. 1 is steered through first transistor 36 and because it exceeds the first current 41, a difference current 68 of amplitude I (equal to the third current 43 less the first current 41) flows along current path 44 from circuit node A.

The differential amplifier 38 has high input impedances so that the difference current 68 flows from the first capacitor 28 and begins to discharge the first capacitor in accordance with the relationship $$\Delta T = (C/I)\Delta V \quad (1)$$

in which C is the capacitance of the capacitor 28, I is the difference current and $\Delta T$ is the time for the voltage at circuit node A to ramp linearly downwards by a voltage $\Delta V$ which is the difference between the limits GND and $-V_D$ (i.e., $\Delta V$ has the magnitude of a diode drop $V_D$). The voltage at circuit node A of FIG. 1 is shown as a solid line 70 in FIG. 2 which also indicates the quantities $\Delta T$ and $\Delta V$.

Because the second transistor 37 is not conducting, the second current 42 flows along current path 45 to circuit node B in FIG. 1 and begins to ramp the voltage of this node linearly upwards with a slope (I/C) that is the inverse of the voltage slope (–I/C) across the first capacitor 28. The voltage at circuit node B is shown as a solid line 71 in FIG. 2.

The voltages 70 and 71 cross each other at a time $\Delta T/2$ and, accordingly, the output of the differential amplifier (38 in FIG. 1) generates a rising edge 72 of the output pulse $P_{OUT}$.

At the falling edge 63 of the input pulse $P_{IN}$, the differential pair 34 of FIG. 1 steers the third current 43 through the second transistor 37 and accordingly, a difference current of aptitude I now flows from circuit node B along current path 45 and the first current 41 flows along current path 44 to circuit node A.

This reverses the operation previously described so that the voltage 70 now ramps upward and the voltage 71 ramps downward as shown in FIG. 2. These voltages again cross each other after a time $\Delta T/2$ so that the output of the differential amplifier (38 in FIG. 1) generates a falling edge 73 of the output pulse $P_{OUT}$. Thus, the output pulse $P_{OUT}$ has the same width as the input pulse $P_{IN}$ and is delayed by a time delay $T_D = \Delta T/2$.

In the circuit operation that was illustrated in FIG. 2, it was assumed that the first and second currents 41 and 42 were equal to a current I and the third current 43 equals a current 2I. However, the teachings of the invention are only limited in that the third current 43 exceed the first and second currents 41 and 42.

As a first example of other timing embodiments, if the first and second currents 41 and 42 equal I and the third current 43 equals 1.7I, the voltage 70 ramps downward with a lesser slope than shown in FIG. 2 so that the delay to the leading edge 72 of the output pulse $P_{OUT}$ increases. After the trailing edge 63 of the input pulse $P_{IN}$, the voltage 71 ramps downward with the same lesser slope so that the trailing edge 73 of the output pulse $P_{OUT}$ is similarly delayed from its position in FIG. 2. In this first example, therefore, the shape of the output pulse $P_{OUT}$ is preserved but the time delay $T_D$ is increased.

As a second example of other embodiments of the invention, if the first and second currents 41 and 42 respectively equal I and 0.7I and the third current 43 equals 2I, the voltage 71 ramps upward with a lesser slope than shown in FIG. 2 so that the delay to the leading edge 72 increases. After the trailing edge 63, the voltage 71 ramps downward with a steeper slope than shown in FIG. 2 so that the trailing edge 73 moves forward from its position in FIG. 2. In this second example, therefore, the time delay $T_D$ is increased and the output pulse $P_{OUT}$ is shortened with respect to the input pulse $P_{IN}$.

In one embodiment of the invention, the first and second capacitors 28 and 30 may be realized with conventional discrete capacitors, i.e., capacitors having a pair of plates separated by a dielectric. In another embodiment of the invention, the first and second capacitors are parasitic capacitors which comprise circuit interconnection structures, e.g., discrete wires. In an embodiment that is particularly suited for use in integrated circuits, however, the first and second capacitors are parasitic capacitors comprised of integrated-circuit interconnection structures, e.g., metallic paths 76 deposited over a circuit substrate 77 as shown in FIG. 3.

The current source 32 includes first and second current transistors 80 and 82 and a current mirror 84. The current transistors 80 and 82 have emitters respectively coupled to a reference voltage $V_{EE}$ by resistors 86 and 88 and are biased by the program signal Sp to respectively generate a coupling current 90 and the third current 43. The current mirror 84 receives the coupling current 90 and, in response, generates the first and second currents 41 and 42.

In particular, the current mirror has a diode-coupled transistor 92 and first and second current transistors 94 and 95 that are respectively coupled to a reference voltage $V_{CC}$ by resistors 97, 98 and 99. The first and second current transistors are biased by the diode-coupled transistor 92 to respectively generate the first and second currents 41 and 42.

In the clamp embodiment shown in FIG. 1, the diode-drop temperature coefficients of diodes 54 and 55 are substantially compensated by the coefficient of diode 58 but the coefficients of diodes 52 and 53 introduce an uncompensated temperature coefficient. If desired, however, other embodiments of the delay circuit 20 of FIG. 1 can include various conventional temperature-independent biasing structures (e.g., zener-referenced bias circuits and band gap-referenced bias circuits) to enhance the temperature independence of the clamp circuit 50 and the current source 32 and, thereby, the temperature independence of the time delay $T_D$.

An interpolator is a timing generator capable of interpolation, i.e., the act of generating additional signals (e.g., pulses) that span a period between existing signals. Additional pulses are often of considerable value for enhancing the accuracy of electronic timing functions. An exemplary application is in ATE where an interpolator can generate specified time delays for application to integrated-circuit DUTs.

FIG. 4 is a timing diagram 110 in which an existing pulse train is exemplified by an input data pulse 112 and a successive input data pulse 113 whose rising edges are spaced apart by a period 114. To these existing pulses, interpolation adds a plurality of interpolation pulses 116 whose leading edges 117 span the period 114 and the leading edges are typically positioned to divide the period 114 into a plurality of substantially equal time intervals 118.

Figure 5:
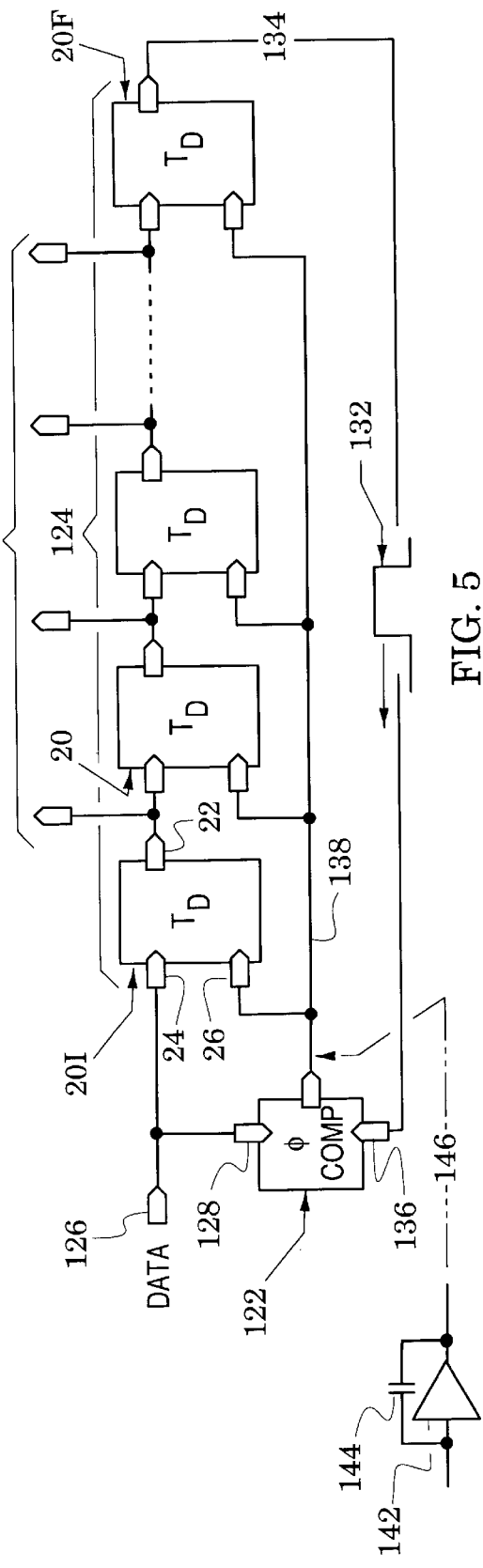
FIG. 5 is a block diagram of an interpolator that includes the circuit of FIG. 1.

FIG. 5 illustrates an interpolator 120 of the present invention that includes N of the programmable time-delay circuits 20 of FIG. 1 and a phase comparator 122. As shown in FIG. 1, each of the time-delay circuits of FIG. 5 have an input port 24, an output port 22 and a program port 26. They are arranged in FIG. 5 in a serially-connected arrangement 124 that begins with an initial time-delay circuit 20I and terminates with a final time-delay circuit 20F. Data signals (e.g., data pulses 112 and 113 of FIG. 4) enter at an interpolator input port 126 which is coupled to the input port 24 of the initial time-delay circuit 20I and to an input port 128 of the phase comparator 122.

To enhance pulse-terminology clarity in the following description of the interpolator 120, it is preferable to state that each of the time-delay circuits 20 generates a delayed pulse at its output port 22 in response to an excitation pulse at its input port 24 and delays the delayed pulse by a delay $T_D$ in response to a program signal at its program port 26 (each delay $T_D$ is indicated in FIG. 5). Because of the serially-connected arrangement 124, the input data pulse (112 in FIG. 4) is the excitation pulse of the initial time-delay circuit 20I and the delayed pulse of each of the time-delay circuits 20 except the final time-delay circuit 20F is coupled to be the excitation pulse of a successive one of the time-delay circuits 20.

The delayed pulse 132 of the final time-delay circuit 20F (the delayed pulse is also shown in FIG. 4) is returned along a feedback path 134 to an input 136 of the phase comparator 122 where its phase is compared to the successive input data pulse (113 in FIG. 4) that arrives at the phase comparator input 128. The phase comparator 122 detects an error whenever the delayed signal 132 is not time-coincident with the successive input data pulse 113 and applies a corrective error signal 138 to the program port 26 of each time-delay circuit 20 to substantially eliminate the error.

The delayed signals of of each of the time-delay circuits 20 except the final time-delay circuit 20F is coupled to an interpolator output port 140 to provide the interpolation pulses 116 of FIG. 4. Because each time-delay circuit 20 generates substantially the same delay in response to the error signal 138 and the delayed signal 132 is controlled to be time-coincident with the successive input data pulse 113, the leading edges 117 divide the period 114 into the equal time intervals 118.

Because the delayed signal 132 and the successive input data pulse 113 are not continuously present at the phase comparator 122, its generation of the error signal 138 is preferably facilitated by an integration process. Accordingly, the phase comparator includes or is augmented by an integrator such as a parallel combination of the buffer amplifier 142 and capacitor 144. If not included in the phase comparator, the integrator can be inserted at the comparator's output as indicated by an insertion arrow 146.

Programmable delay circuits and interpolators of the invention are particularly suited for high-speed (e.g., ~1 GHz) applications (e.g., ATE signal generation) and they are configured for economic realization as portions of ASICs.

The invention has been illustrated with reference to particular transistors, e.g., the bipolar transistors of FIG. 1. However, the teachings of the invention may be practiced with various transistor types such as MOS transistors. This is exemplified in FIG. 1 where an MOS transistor 150 replaces the bipolar transistor 37 as indicated by a replacement arrow 152.

Various conventional phase comparators (e.g., a D-type flip-flop) can be used to realize embodiments of the invention and various conventional voltage clamps and current sources can be used of which the clamp 50 and the current source 32 of FIG. 1 are exemplary.

The preferred embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A programmable time-delay circuit that generates an output pulse in response to an input pulse and delays the output pulse in response to a program signal, comprising:

first and second capacitors that are charged to first and second voltages;

a differential amplifier that generates said output pulse in response to said first and second voltages;

a programmable current source that generates first, second and third currents with amplitudes that are responsive to said program signal wherein said first and second currents are respectively coupled to said first and second capacitors and said third current exceeds said first and second currents; and a differential pair of first and second transistors that are respectively coupled to said first and second capacitors with said differential pair arranged to steer said third current through either selected one of said first and second transistors in response to said input pulse;

said first capacitor thereby charged in one direction by said first current and charged in another direction by a current that is the difference between said third current and said first current; and said second capacitor thereby charged in one direction by said second current and in another direction by a current that is the difference between said third current and said second current.

2. The time-delay circuit of claim 1, further including an interconnection system which connects said differential amplifier, said current source and said differential pair and wherein said first and second capacitors are each a parasitic capacitor formed by said interconnection system.

3. The time-delay circuit of claim 2, wherein said interconnection system includes:

a substrate; and metallic circuit paths carried by said substrate.

4. The time-delay circuit of claim 1, wherein said first and second currents are substantially equal.

5. The time-delay circuit of claim 4, wherein said third current is substantially twice said first current.

6. The time-delay circuit of claim 1, wherein said current source includes:

first and second current transistors that are arranged to respectively provide said third current and a coupling current with amplitudes that are responsive to said program signal; and a current mirror that generates said first and second currents in response to said coupling current.

7. The time-delay circuit of claim 1, further including a first clamp coupled to said first and second capacitors and arranged to limit said first and second voltages below a first limit voltage; and a second clamp coupled to said first and second capacitors and arranged to limit said first and second voltages above a second limit voltage.

8. The time-delay circuit of claim 7, wherein said first clamp includes first and second diodes with their anodes respectively coupled to said first and second capacitors; and said second clamp includes third and fourth diodes with their cathodes respectively coupled to said first and second capacitors.

9. A method of generating an output pulse in response to a leading edge and a trailing edge of an input pulse and delaying said output pulse in response to a program signal, comprising the steps of:

providing first, second and third currents with amplitudes responsive to said program signal wherein said third current exceeds said first and second currents;

directing said first and second currents respectively along first and second paths that respectively include first and second capacitors;

in response to said leading edge, steering said third current along said first path;

in response to said trailing edge, steering said third current along said second path; and differentially amplifying voltages on said first and second capacitors to generate said output pulse with a delay responsive to said program signal.

10. The method of claim 9, wherein said providing step includes the step of forming said first and second currents to be substantially equal.

11. The method of claim 10, wherein said providing step further includes the step of forming said third current to be substantially twice said first current.

12. The method of claim 9, further including the step of limiting said voltages between first and second limits.

13. The method of claim 9, further including the step of forming said first and second capacitors with parasitic circuit elements.

14. An interpolator that responds to an input data pulse by generating N output data pulses that span a period between said input data pulse and a successive input data pulse, the interpolator comprising:

N+1 programmable time-delay circuits that each generates a delayed pulse in response to an excitation pulse and delays said delayed pulse in response to a program signal;

wherein each of said programmable time-delay circuits includes:

a) first and second capacitors that are charged to first and second voltages;

b) a differential amplifier that generates said delayed pulse in response to said first and second voltages;

c) a programmable current source that generates first, second and third currents with amplitudes that are responsive to said program signal wherein said first and second currents are respectively coupled to said first and second capacitors and said third current exceeds said first and second currents; and d) a differential pair of first and second transistors that are respectively coupled to said first and second capacitors with said differential pair coupled to said current source to steer said third current through either selected one of said first and second transistors in response to said excitation pulse;

wherein said time-delay circuits are arranged in a serially-connected arrangement that begins with an initial one of said time-delay circuits and terminates with a final one of said time-delay circuits;

and wherein said input data pulse is the excitation pulse of said initial time-delay circuit and the delayed pulse of each of said time-delay circuits except said final time-delay circuit is coupled to be the excitation pulse of a successive one of said time-delay circuits;

and a phase comparator that generates said program signal in response to the phase difference between said successive input data pulse and the delayed pulse of said final time-delay circuit;

the delayed pulses of all of said time-delay circuits except said final time-delay circuit comprising said N output data pulses.

15. The interpolator of claim 14, further including a interconnection system which connects said differential amplifier, said current source and said differential pair and wherein said first and second capacitors are each a parasitic capacitor formed by said interconnection system.

16. The interpolator of claim 15, wherein said interconnection system includes:

a substrate; and metallic circuit paths carried by said substrate.

17. The interpolator of claim 14, wherein each of said time-delay circuits further includes:

a first clamp coupled to said first and second capacitors and arranged to limit said first and second voltages below a first limit voltage; and a second clamp coupled to said first and second capacitors and arranged to limit said first and second voltages above a second limit voltage.

* * * * *